(12) United States Patent
Osumi et al.

(10) Patent No.: US 8,922,011 B2
(45) Date of Patent: Dec. 30, 2014

(54) MOUNTING STRUCTURE OF ELECTRONIC COMPONENT WITH JOINING PORTIONS AND METHOD OF MANUFACTURING THE SAME

(71) Applicant: Panasonic Corporation, Kadoma-shi, Osaka (JP)

(72) Inventors: Takatoshi Osumi, Nara (JP); Daisuke Sakurai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/891,566

(22) Filed: May 10, 2013

(65) Prior Publication Data

US 2013/0307146 A1  Nov. 21, 2013

(30) Foreign Application Priority Data

May 15, 2012 (JP) .................. 2012-111074

(51) Int. Cl.
*H01L 23/498* (2006.01)
*H01L 21/768* (2006.01)
*H01L 23/00* (2006.01)
*H01L 23/14* (2006.01)
*H01L 23/15* (2006.01)

(52) U.S. Cl.
CPC .... *H01L 23/49811* (2013.01); *H01L 21/76885* (2013.01); *H01L 24/13* (2013.01); *H01L 24/16* (2013.01); *H01L 24/17* (2013.01); *H01L 23/147* (2013.01); *H01L 23/15* (2013.01);

(Continued)

(58) Field of Classification Search
CPC ....... H01L 23/02; H01L 23/48; H01L 23/488; H01L 23/49811; H01L 23/15; H01L 21/76885; H01L 23/147
USPC ............ 257/737, 738, 778, E23.069, E23.01, 257/697, 693, 698, 777, 780, 781, 782, 783, 257/789, 690, 795, 72
See application file for complete search history.

(56) References Cited

U.S. PATENT DOCUMENTS 6,229,220 B1   5/2001 Saitoh et al.
6,784,543 B2 *  8/2004 Matsuki et al. ............... 257/746

(Continued)

FOREIGN PATENT DOCUMENTS

JP    2004-356294    12/2004
JP      09-097791    4/2007

(Continued)

*Primary Examiner* — Alexander Oscar Williams
(74) *Attorney, Agent, or Firm* — Hamre, Schumann, Mueller & Larson, P.C.

(57) ABSTRACT

A mounting structure of an electronic component includes a plurality of joining portions that join a plurality of first electrode terminals on the electronic component to a plurality of second electrode terminals on a circuit board. The joining portions each include a first projecting electrode formed on the first electrode terminal, a second projecting electrode formed on the second electrode terminal, and a solder portion that joins the first projecting electrode to the second projecting electrode. The end face of the first projecting electrode is larger in area than the end face of the second projecting electrode, and at least a part of the second electrode terminals exposed from the circuit board has a larger area than the bottom of the second projecting electrode.

10 Claims, 6 Drawing Sheets

(52) U.S. Cl.
CPC .......... *H01L 2224/10175* (2013.01); *H01L 2224/81825* (2013.01); *H01L 2224/05541* (2013.01); *H01L 2224/05555* (2013.01); *H01L 2224/05567* (2013.01); *H01L 2224/11462* (2013.01); *H01L 2224/1147* (2013.01); *H01L 2224/11849* (2013.01); *H01L 2224/13022* (2013.01); *H01L 2224/13082* (2013.01); *H01L 2224/13083* (2013.01); *H01L 2224/13109* (2013.01); *H01L 2224/13111* (2013.01); *H01L 2224/13144* (2013.01); *H01L 2224/13147* (2013.01); *H01L 2224/13155* (2013.01); *H01L 2224/13164* (2013.01); *H01L 2224/1703* (2013.01); *H01L 2224/17051* (2013.01); *H01L 2224/81191* (2013.01); *H01L 2224/81203* (2013.01); *H01L 2224/81447* (2013.01); *H01L 2224/81455* (2013.01); *H01L 2224/81815* (2013.01); *H01L 2224/81048* (2013.01); *H01L 2224/16238* (2013.01); *H01L 2924/3511* (2013.01)
USPC .......... 257/737; 257/E23.069; 257/E23.01; 257/738; 257/778; 257/697; 257/693; 257/698; 257/780; 257/78; 257/782; 257/783

(56) References Cited

U.S. PATENT DOCUMENTS

| | | | | |
|---|---|---|---|---|
| 7,456,502 | B2 * | 11/2008 | Tanida et al. | 257/778 |
| 7,486,712 | B2 * | 2/2009 | Hata et al. | 372/50.121 |
| 7,598,613 | B2 * | 10/2009 | Tanida et al. | 257/737 |
| 7,971,349 | B2 | 7/2011 | Tanaka et al. | |
| 8,119,449 | B2 * | 2/2012 | Sakurai et al. | 438/108 |
| 8,269,335 | B2 * | 9/2012 | Osumi | 257/697 |
| 8,575,751 | B2 * | 11/2013 | Sakurai et al. | 257/750 |
| 2003/0151141 | A1 * | 8/2003 | Matsuki et al. | 257/746 |
| 2004/0232533 | A1 | 11/2004 | Hatakeyama | |
| 2005/0012123 | A1 * | 1/2005 | Adachi | 257/276 |
| 2006/0186519 | A1 * | 8/2006 | Inoue et al. | 257/678 |
| 2007/0234563 | A1 | 10/2007 | Sakaguchi et al. | |
| 2008/0017873 | A1 | 1/2008 | Tomoda et al. | |
| 2011/0233767 | A1 * | 9/2011 | Sakurai | 257/737 |

FOREIGN PATENT DOCUMENTS

| | | | |
|---|---|---|---|
| JP | 2008-205260 | | 9/2008 |
| JP | 2009-238806 | | 10/2009 |
| JP | 2010-103129 A | * | 5/2010 |
| JP | 2013-239543 | * | 11/2013 |
| KR | 10-2006-0084793 | | 7/2006 |

* cited by examiner

MOUNTING STRUCTURE OF ELECTRONIC COMPONENT WITH JOINING PORTIONS AND METHOD OF MANUFACTURING THE SAME

The disclosure of Japanese Patent Application No. 2012-111074 filed May 15, 2012 including specification, drawings and claims is incorporated herein by reference in its entirety.

FIELD OF THE INVENTION

The present invention relates to a mounting structure of an electronic component, the mounting structure including a circuit board and the electronic component, e.g., a semiconductor chip mounted on the circuit board.

BACKGROUND OF THE INVENTION

A mounting structure including a circuit board and a semiconductor chip such as an LSI mounted on the circuit board is manufactured by flip-chip mounting. In flip-chip mounting, projecting electrodes such as solder bumps are formed on the respective electrode terminals of a semiconductor chip, and then the semiconductor chip is mounted face down on the circuit board. Specifically, at least one of the semiconductor chip and the circuit board is heated; meanwhile, the projecting electrodes on the semiconductor chip are pressed to the respective electrode terminals of the circuit board.

Generally, a method of forming solder bumps includes the steps of: feeding solder onto the electrode terminals of a semiconductor chip by using a dispenser, screen printing, or electroplating; and heating the semiconductor chip at least to the melting point of the solder in a reflow furnace or the like. In the use of solder bumps, a space between the semiconductor chip and a circuit board is filled with molding resin so as to reinforce a bonding strength between the projecting electrodes on the semiconductor chip and electrode terminals on the circuit board.

In addition to solder bumps, projecting electrodes made of gold or copper are also available. Projecting electrodes made of gold or copper are formed by, for example, electroplating. In the use of projecting electrodes made of gold or copper, generally, an anisotropic conductive film containing an adhesive and metallic particles mixed in the adhesive is disposed between a semiconductor chip and a circuit board, and then the projecting electrodes on the semiconductor chip are pressed to electrode terminals on the circuit board.

Generally, electrode terminals on a semiconductor chip are arranged in a single row or are staggered in two rows on the outer end of the semiconductor chip. In order to obtain higher densities and higher pin counts on a semiconductor chip, a distance between electrode terminals has been shortened (smaller pitches) and an electrode area has been reduced. Pitches, in particular, have been considerably shortened. Thus, in the case where electrode terminals are arranged in one or two rows on the outer end of a semiconductor chip, a short circuit may occur between the electrode terminals or a faulty connection may occur depending upon a thermal stress caused by a difference in thermal expansion coefficient between the semiconductor chip and a circuit board.

Specifically, using solder bumps may cause a so-called a solder bridge leading to a short circuit between the electrode terminals. The solder bridge occurs when molten solder is deformed in flip-chip mounting so as to connect adjacent solder bumps with a solder surface tension. Thus, as the pitches of the electrode terminals decrease, solder bridges are more likely to occur. Moreover, a faulty connection occurs depending upon a thermal stress caused by a difference in thermal expansion coefficient between the semiconductor chip and the circuit board when molding resin to be fed into a gap between the semiconductor chip and the circuit board does not spread over the gap and only fills a part of the gap. Thus, as the pitches of the electrode terminals decrease, a flow of molding resin may be blocked so as to increase the possibility of the faulty connections caused by a thermal stress.

As has been discussed, as a distance between the electrode terminals decreases (smaller pitches), a short circuit may occur between the electrode terminals or a faulty connection may occur depending upon a thermal stress caused by a difference in thermal expansion coefficient between the semiconductor chip and the circuit board. Thus, in order to increase a distance between the electrode terminals, the electrode terminals are arranged in a matrix (grid pattern) in the plane (in the area) of the semiconductor chip. Electrode terminals arranged in a matrix (grid pattern) in the plane of a semiconductor chip have a larger layout area than electrode terminals arranged in one or two rows only on the outer end of the semiconductor chip, thereby increasing a distance between the electrode terminals.

In recent years, however, a distance has been considerably reduced between electrode terminals (smaller pitches) arranged in a matrix (grid pattern) on a semiconductor chip. Thus, also in the case where the electrode terminals are arranged in a matrix (grid pattern) in the plane of the semiconductor chip, short circuits are likely to occur between the electrode terminals.

In order to solve the problem, for example, Japanese Patent Laid-Open No. 9-97791 proposes a projecting electrode having a two-layer structure in which an upper solder electrode is formed on a high-melting lower electrode that does not melt during flip-chip mounting. The projecting electrode requires a smaller amount of solder than a solder bump including only solder, and reduces the amount of solder projection in a planar direction during flip-chip mounting, thereby reducing the occurrence of solder bridges.

DISCLOSURE OF THE INVENTION

Figure 7:
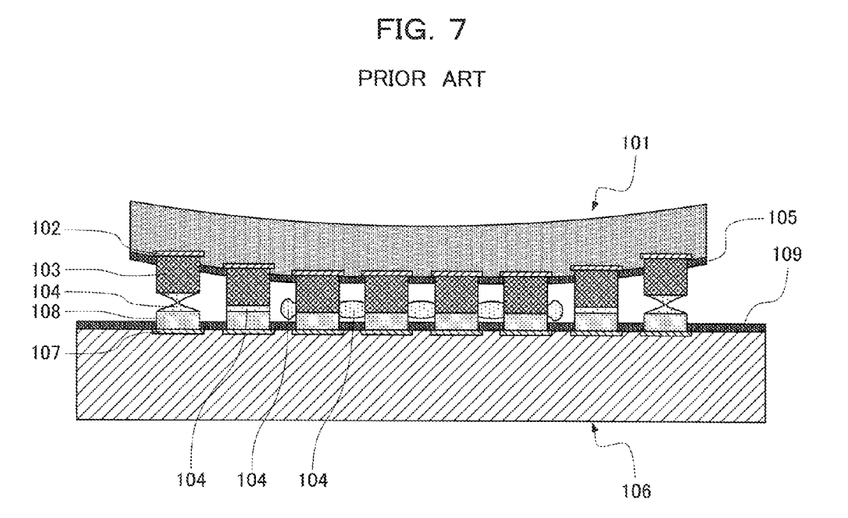
FIG. 7 is a cross-sectional view for explaining a conventional mounting structure.
Figure 8:
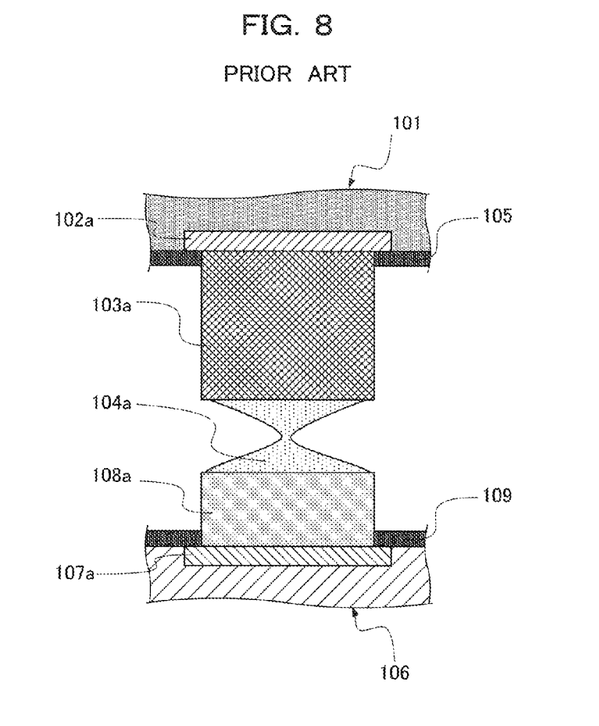
FIG. 8 is an enlarged cross-sectional view for explaining a joining portion of the conventional mounting structure.
Figure 9:
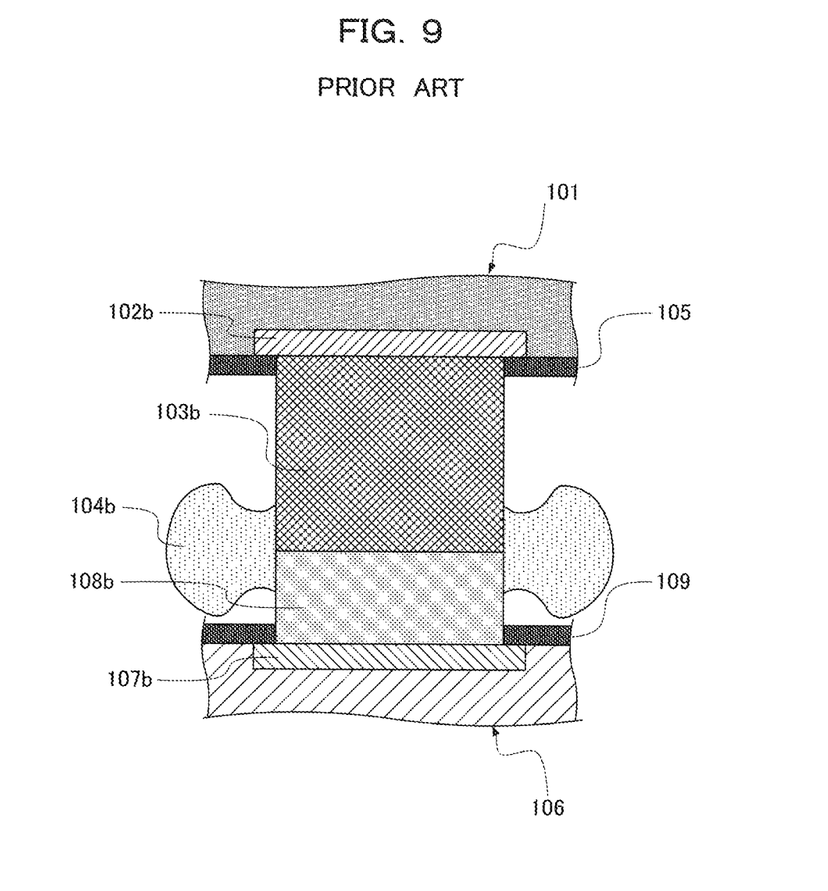
FIG. 9 is an enlarged cross-sectional view for explaining another joining portion of the conventional mounting structure.

In recent years, however, there has been an increasing demand for thinner semiconductor devices. To meet the demand, semiconductor chips have been 50 µm or less in thickness and a distance between a semiconductor chip and a circuit board has been set at 25 µm or less. Therefore, a large warp is likely to occur on a semiconductor chip because of a difference in thermal expansion coefficient between the inner layers of the semiconductor chip and a difference in thermal expansion coefficient between the semiconductor chip and a circuit board. Even in the use of a projecting electrode having a two-layer structure in which an upper solder electrode including solder is formed on the top of a high-melting lower electrode, a large warp on a semiconductor chip is found to cause the following problems:

FIGS. 7 to 9 are cross-sectional views for explaining a mounting structure having projecting electrodes, each having a two-layer structure described in Japanese Patent Laid-Open No. 9-97791.

As shown in FIG. 7, the projecting electrodes having the two-layer structures are provided on electrode terminals 102 of a semiconductor chip 101. The projecting electrode on each of the electrode terminals 102 includes a cylindrical high-melting lower layer electrode 103 that does not melt during flip-chip mounting and an upper electrode formed on the cylindrical lower layer electrode 103. The upper layer electrode includes solder 104. The semiconductor chip 101 further includes a protective film 105 that protects an overall surface where the electrode terminals 102 are provided. The protective film 105 has a plurality of openings for the respective electrode terminals 102. The cylindrical lower layer electrodes 103 project from the respective openings.

On electrode terminals 107 of a circuit board 106, only high-melting cylindrical electrodes 108 having a high melting point are formed that do not melt during flip-chip mounting. The circuit board 106 further includes a protective film 109 that protects an overall surface where the electrode terminals 107 are provided. The protective film 109 has a plurality of openings for the respective electrode terminals 107. The cylindrical electrodes 108 project from the respective openings.

During flip-chip mounting, at least one of the semiconductor chip 101 and the circuit board 106 is heated; meanwhile, the cylindrical lower layer electrodes 103 on the semiconductor chip 101 are pressed to the cylindrical electrodes 108 on the circuit board 106 to melt the solder 104. Thus, the molten solder 104 spreads and joins to the cylindrical electrodes 108 on the circuit board 106, mounting the semiconductor chip 101 onto the circuit board 106.

Typically, the cylindrical lower layer electrodes 103 on the semiconductor chip 101 and the cylindrical electrodes 108 on the circuit board 106 have the same or nearly the same diameter. Hence, as shown in FIG. 7, a warp occurs on the semiconductor chip 101 and causes variations in distance between the semiconductor chip 101 and the circuit board 106 in the plane of the semiconductor chip 101, causing problems illustrated in FIGS. 8 and 9. Specifically, as shown in FIG. 8, a warp on the semiconductor chip 101 increases a distance between the semiconductor chip 101 and the circuit board 106, insufficiently supplying solder 104*a* in an area for stretching the solder 104*a*, relative to a distance between the semiconductor chip 101 and the circuit board 106. This may cause faulty electrical continuity between the electrode terminals 102*a* of the semiconductor chip 101 and the electrode terminals 107*a* of the circuit board 106. In some cases, the electrode terminals 102*a* of the semiconductor chip 101 may not be electrically connected to the electrode terminals 107*a* of the circuit board 106. In an area where a warp on the semiconductor chip 101 reduces a distance between the semiconductor chip 101 and the circuit board 106, as shown in FIG. 9, solder 104*b* is excessively supplied relative to the distance between the semiconductor chip 101 and the circuit board 106 and increases the amount of projection of the solder 104*b* in the planar direction, leading to a solder bridge.

An object of the present invention is to provide a mounting structure of an electronic component so as to obtain high connection reliability even in the case where the electronic component, e.g., a warped semiconductor chip is mounted on a circuit board. Another object of the present invention is to provide a method of manufacturing a mounting structure of an electronic component so as to obtain high connection reliability even in the case where the electronic component, e.g., a warped semiconductor chip is mounted on a circuit board.

In order to attain the object, a mounting structure of an electronic component according to the present invention includes: the electronic component having a plurality of first electrode terminals; a circuit board having a plurality of second electrode terminals for the respective first electrode terminals; and a plurality of joining portions that join the first electrode terminals to the respective second electrode terminals, wherein the joining portions each include a first projecting electrode formed on the first electrode terminal, a second projecting electrode formed on the second electrode terminal, and a solder portion that joins the first projecting electrode to the second projecting electrode, the first projecting electrode may have an end face larger in area than an end face of the second projecting electrode, and at least a part of the second electrode terminals exposed from the circuit board may have an area larger than an area of the bottom of the second projecting electrode.

Furthermore, the second electrode terminal located in a region corresponding to the outer end of the electronic component may be exposed from the circuit board so as to have a smaller exposed area than the second electrode terminal located in a region corresponding to the center of the electronic component.

Moreover, the first projecting electrodes may be columnar, and the second projecting electrodes may be columnar.

Furthermore, the solder portions may be disposed around the respective second projecting electrodes.

Moreover, the area of the end face of the first projecting electrode, the volume of the solder portion joining the first electrode to the second projecting electrode, the area of one of the end face and the bottom of the second projecting electrode, and the height of the second projecting electrode may satisfy the relationship of an expression below:

$$\text{The volume of the solder portion} \leq (\text{the area of the end face of the first projecting electrode} - \text{the area of one of the end face and the bottom of the second projecting electrode}) \times \text{the height of the second projecting electrode}.$$

Furthermore, the first projecting electrodes may be cylindrical, the second projecting electrodes may be cylindrical, and the second projecting electrodes may each have a height and a diameter such that the height is not larger than the diameter.

Moreover, the first projecting electrodes may be cylindrical, the second projecting electrodes may be cylindrical, and the second projecting electrodes may be 0.4 to 0.7 times larger in diameter than the first projecting electrodes.

Furthermore, the first projecting electrodes may contain copper.

Moreover, the second projecting electrodes may contain one of copper and nickel.

Furthermore, each of the second projecting electrodes may include a gold surface layer.

Moreover, the solder portions may contain tin.

In order to attain the object, a method of manufacturing the mounting structure of the electronic component according to the present invention, the mounting structure including: the electronic component having a plurality of first electrode terminals; a circuit board having a plurality of second electrode terminals for the respective first electrode terminals; and a plurality of joining portions that join the first electrode terminals to the respective second electrode terminals, the method including the steps of: forming the first projecting electrodes on the respective first electrode terminals; forming the second projecting electrodes on the respective second electrode terminals; feeding solder to the first projecting electrodes; and forming the joining portions by bringing the end faces of the first projecting electrodes into contact with the respective end faces of the second projecting electrodes with the molten solder.

Furthermore, when the joining portions are formed, a pressure may be applied to the end faces of the first projecting electrodes from the end faces of the second projecting electrodes so as to form recesses on the respective end faces of the first projecting electrodes.

The present invention achieves high connection reliability even in the case where the electronic component, e.g., a warped semiconductor chip is mounted on the circuit board.

DESCRIPTION OF THE EMBODIMENT

An embodiment of the present invention will be described below with reference to the accompanying drawings. Constituent elements in the drawings are schematically illustrated for understanding and are different in thickness, length, and number from actual constituent elements for the preparation of the drawings. The materials, shapes, and dimensions of the constituent elements in the following embodiment are merely exemplary and are not particularly limited. The embodiment may be changed in various ways without substantially departing from the effect of the present invention.

As an example of a mounting structure of an electronic component, the following embodiment will describe a mounting structure including a circuit board and a semiconductor chip mounted on the circuit board. The semiconductor chip is an example of an electronic component and is selected from, for example, a silicon (Si) semiconductor chip and a gallium arsenide (GaAs) semiconductor chip. The electronic component is not limited to a semiconductor chip. The same effect as the embodiment can be obtained when the electronic component is a passive component, e.g., a capacitor, a coil, or a resistor.

Figure 1:
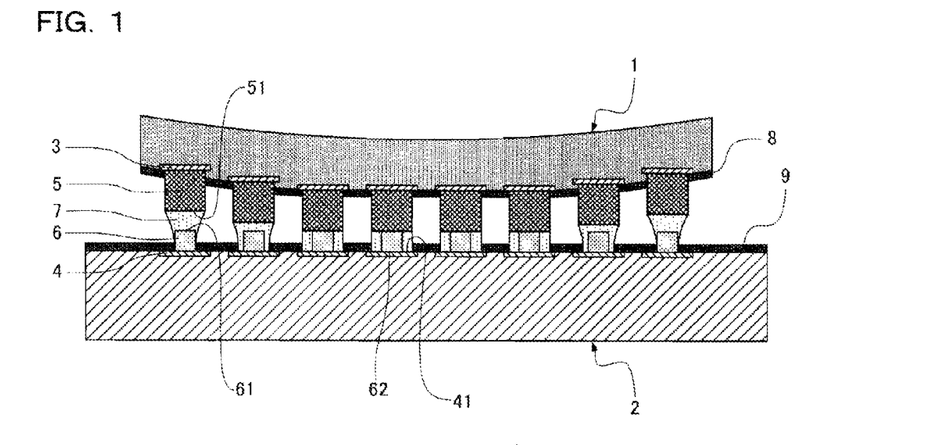
FIG. 1 is a cross-sectional view for explaining a mounting structure of an electronic component according to an embodiment of the present invention.

FIG. 1 is a cross-sectional view for explaining the mounting structure of the electronic component according to the present embodiment.

As shown in FIG. 1, a semiconductor chip 1 includes a surface opposed to a circuit board 2 and a plurality of electrode terminals (first electrode terminals) 3. The electrode terminals 3 are arranged at regular intervals in a matrix (grid pattern) on the inner layer of the surface opposed to the circuit board 2. Specifically, a multilayer wiring layer is provided inside the surface opposed to the circuit board 2, and the electrode terminals 3 are provided on the outermost surface of the multilayer wiring layer. The multilayer wiring layer includes, for example, a thin wiring layer (not shown) made of copper (Cu) or aluminum (Al), and an interlayer insulating film (not shown) including a weak low-dielectric constant insulating layer, e.g., a low-k layer or an ultra low-k layer.

The low-dielectric constant insulating layer has a thickness of several hundreds nanometers. The electrode terminals 3 are made of aluminum alloys such as an Al—Cu alloy, an Al—Si—Cu alloy, or an Al—Si alloy. Alternatively, the electrode terminals 3 are made of Cu or Al. In the present embodiment, the electrode terminals 3 are made of Al.

The circuit board 2 includes a plurality of electrode terminals (second electrode terminals) 4 opposed to the respective electrode terminals 3 of the semiconductor chip 1. The material of the circuit board 2 is selected from, for example, silicon, polysilicon, and glass. The electrode terminals 4 are made of aluminum alloys such as an Al—Cu alloy, an Al—Si—Cu alloy, or an Al—Si alloy. Alternatively, the electrode terminals 4 are made of Cu or Al. In the present embodiment, the electrode terminals 4 are made of Al.

Projecting electrodes (first projecting electrodes) 5 shaped like columns such as cylinders and prisms are provided on the respective electrode terminals 3 of the semiconductor chip 1. Projecting electrodes (second projecting electrodes) 6 shaped like columns such as cylinders and prisms are provided on the respective electrode terminals 4 of the circuit board 2.

The projecting electrodes 5 on the semiconductor chip 1 are electrically and mechanically connected to the respective projecting electrodes 6 on the circuit board 2 via a plurality of solder portions 7. Thus, a plurality of joining portions for joining the electrode terminals 3 of the semiconductor chip 1 to the respective electrode terminals 4 of the circuit board 2 respectively include the projecting electrodes 5, the projecting electrodes 6, and the solder portions 7. The joining portions are arranged at regular intervals in a matrix (grid pattern) between the semiconductor chip 1 and the circuit board 2.

The projecting electrodes 5 are made of, for example, copper (Cu). Alternatively, the material of the projecting electrodes 5 may be selected from, for example, a Ni—P (phosphorus) alloy, a Ni—B (boron) alloy, and Ni. The projecting electrode 5 may have, for example, a three-layer structure containing Ni/Pd (palladium)/Au (gold).

The projecting electrodes 6 are made of, for example, copper (Cu). Alternatively, the material of the projecting electrodes 6 may be selected from, for example, a Ni—P (phosphorus) alloy, a Ni—B (boron) alloy, and Ni. The projecting electrode 6 may have a three-layer structure containing Ni/Pd (palladium)/Au (gold).

The solder portions 7 are made of, for example, Sn—Ag solder, Sn—Ag—Cu solder, Sn—Zn (zinc) solder, Sn—Zn—Bi (bismuth) solder, a Sn—Pb (lead) solder, a Sn—Bi solder, Sn—Ag—Bi—In (indium) solder, or Sn—In solder. Alternatively, the solder portions 7 are made of In or Sn.

In the present embodiment, the projecting electrodes 5 on the semiconductor chip 1 are mainly composed of copper (Cu), the projecting electrodes 6 on the circuit board 2 are mainly composed of nickel (Ni), and the solder portions 7 are mainly composed of tin (Sn).

The semiconductor chip 1 includes a protective film 8 that protects the surface opposed to the circuit board 2. The protective film 8 has a plurality of openings for the respective electrode terminals 3. At least a part of the surface of the electrode terminal 3 is exposed from each of the openings of the protective film 8, and the projecting electrodes 5 are provided on the respective electrode terminals 3 exposed from the protective film 8. Thus, the projecting electrodes 5 project from the respective openings of the protective film 8.

Similarly, the circuit board 2 includes a surface opposed to the semiconductor chip 1 and a protective film 9 that protects the surface opposed to the semiconductor chip 1. The protective film 9 has a plurality of openings for the respective electrode terminals 4. At least a part (indicated at 41) of the surface of the electrode terminal 4 is exposed from each of the openings of the protective film 9, and the projecting electrodes 6 are provided on the respective electrode terminals 4 exposed from the protective film 9. Thus, the projecting electrodes 6 project from the respective openings of the protective film 9.

The protective films 8 and 9 are made of, for example, silicon nitride (SiN) or polyimide. In the present embodiment, the material of the protective films 8 and 9 is SiN.

The top (end face) 51 of the projecting electrode 5 on the semiconductor chip 1 has a larger area than the top (end face) 61 of the projecting electrode 6 on the circuit board 2. Hence, in the case where the projecting electrodes 5 and 6 are cylindrical, the top (end face) 51 of the projecting electrode 5 on the semiconductor chip 1 has a larger diameter than the top (end face) 61 of the projecting electrode 6 on the circuit board 2.

Figure 3:
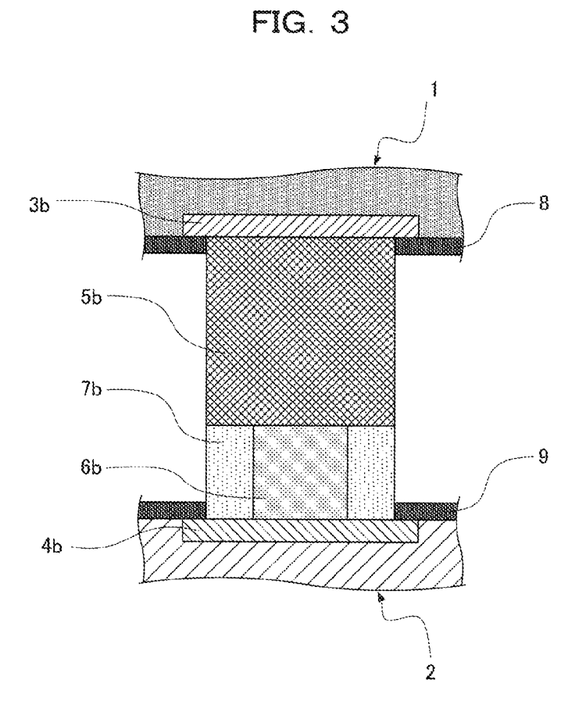
FIG. 3 is an enlarged cross-sectional view for explaining another joining portion included in the mounting structure of the electronic component according to the embodiment of the present invention.

A part of the openings on the protective film 9 of the circuit board 2 (a part 41 of the electrode terminals 4 exposed from the circuit board 2) contains a larger area than the bottom 62 of the projecting electrode 6 on the circuit board 2. In the case where the joining portions vary in height, the shortest joining portion is located in one of the openings of the protective film 9 on the circuit board 2 and at least the opening preferably has a larger area than the bottom 62 of the projecting electrode 6 projecting from the opening. As shown in FIG. 3, one of the openings of the protective film 9 on the circuit board 2 contains the joining portion where the tops of a projecting electrode 5b and a projecting electrode 6b come into contact with each other, and at least the opening preferably has a larger area than the bottom of the projecting electrode 6b projecting from the opening. The openings of the protective film 9 on the circuit board 2 may be larger in area than the bottoms of the protruding electrodes projecting from the respective openings, except for the opening containing the tallest joining portion. Furthermore, the opening containing the taller joining portion on the protective film 9 may have a smaller area than the opening containing the shorter joining portion on the protective film 9. Alternatively, all the openings of the protective film 9 on the circuit board 2 may be larger in area than the bottoms 62 of the projecting electrodes 6 projecting from the respective openings.

As shown in FIG. 1, the joining portions on the outer end of the semiconductor chip 1 are taller than the joining portions around the center of the semiconductor chip 1. In this case, the openings of the protective film 9 corresponding to the outer end of the semiconductor chip 1 may be smaller in area than the openings of the protective film 9 corresponding to the center of the semiconductor chip 1. As shown in FIG. 1, in the case where a distance between the semiconductor chip 1 and the circuit board 2 gradually increases toward the end of the semiconductor chip 1, the opening containing the taller joining portion on the protective film 9 may have a smaller area than the opening containing the shorter joining portion on the protective film 9.

Figure 2:
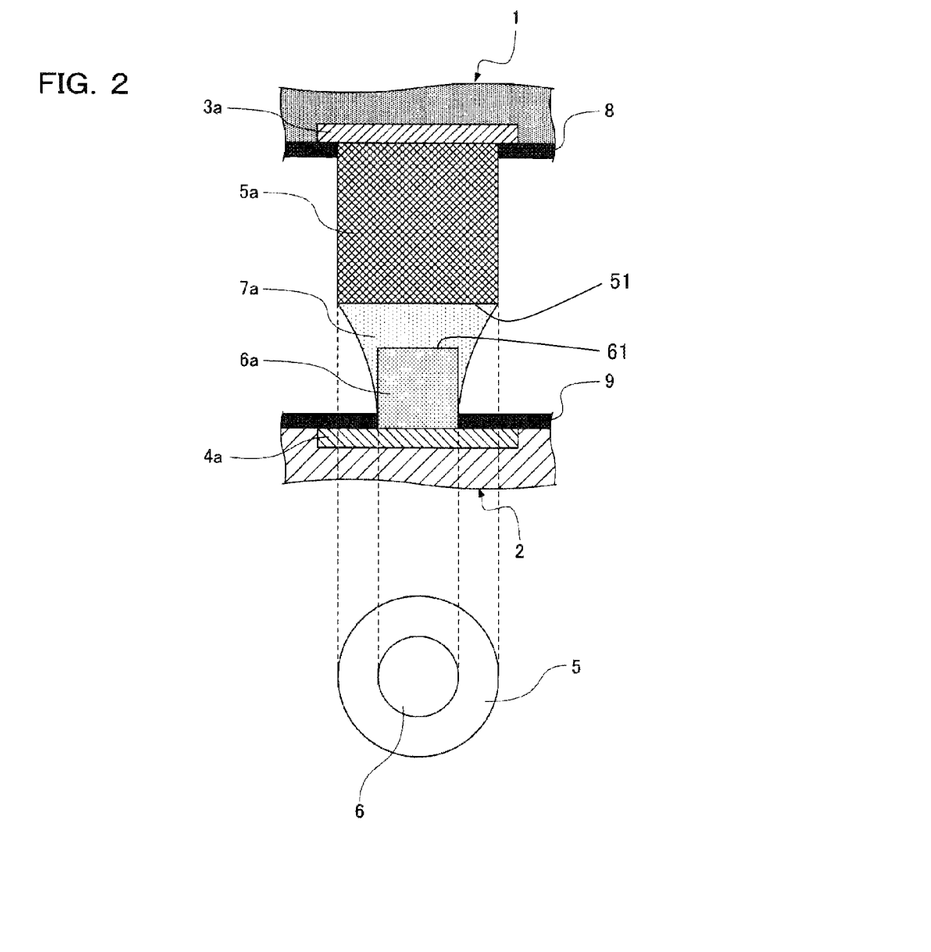
FIG. 2 is an enlarged cross-sectional view for explaining a joining portion included in the mounting structure of the electronic component according to the embodiment of the present invention, including a bottom plan view of the joining portion.

For example, in the case where the semiconductor chip 1 having a rectangular outside shape is flip-chip mounted on the circuit board 2, the semiconductor chip 1 projects downward. This is because a thermal stress concentrates on the corners (curved portions) of the outside shape of the semiconductor chip 1 in the step of cooling molten solder during the flip-chip mounting process. The thermal stress is caused by a difference in modulus of elasticity and a difference in coefficient of linear expansion between the semiconductor chip 1 and the circuit board 2, a difference in modulus of elasticity and a difference in coefficient of linear expansion between the inner layers of the semiconductor chip 1, and a difference in modulus of elasticity and a difference in coefficient of linear expansion between the inner layers of the circuit board 2. The warped semiconductor chip 1 causes the joining portions formed near the corners of the outside shape of the semiconductor chip 1 to be taller than the joining portions formed around the center of the semiconductor chip 1. As a result, as shown in FIG. 2, the solder portion 7 contained in each of the joining portions includes a solder portion 7a that is stretched near the corner of the outside shape of the semiconductor chip 1. In the mounting structure of the present embodiment, however, the end face 61 of the projecting electrode 6 on the circuit board 2 has a smaller area than the end face 51 of the projecting electrode 5 on the semiconductor chip 1. Thus, even when the solder portion 7a is stretched as shown in FIG. 2, wet solder forming the solder portion 7a spreads in a wet state to the side of the projecting electrode 6a on the circuit board 2. This reduces the occurrence of faulty electrical connections between electrode terminals 3 on the semiconductor chip 1 and electrode terminals 4 on the circuit board 2. At the center of the semiconductor chip 1, as shown in FIG. 3, the top of the projecting electrode 5b on the semiconductor chip 1 and the top of the projecting electrode 6b on the circuit board 2 are in contact with each other. Thus, solder forming the solder portion 7b is pressed out between the top of the projecting electrode 5b and the top of the projecting electrode 6b. In the mounting structure of the present embodiment, however, the end faces 61 of the projecting electrodes 6 on the circuit board 2 are smaller in area than the end faces 51 of the projecting electrodes 5 on the semiconductor chip 1. As shown in FIG. 3, out of the openings of the protective film 9 on the circuit board 2, the opening containing the joining portion where the tops of the projecting electrode 5b and the projecting electrode 6b are in contact with each other has a larger area than the bottom of the projecting electrode 6b projecting from the opening. Thus, wet solder pressed out between the top of the projecting electrode 5b and the top of the projecting electrode 6b spreads to the side of the projecting electrode 6b and the surface of an electrode terminal 4b exposed from the protective film 9. Thus, the solder portion 7b is unlikely to protrude from the projection area of the bottom of the projecting electrode 5b on the semiconductor chip 1, reducing the occurrence of solder bridges.

In the present embodiment, the outside shape of the semiconductor chip 1 is an 8×8 mm square, and the semiconductor chip 1 is 0.05 mm in thickness. The outside shape of the circuit board 2 is a 16×16 mm square, and the circuit board 2 is 0.15 mm in thickness.

In the present embodiment, the electrode terminal 3 on the semiconductor chip 1 is shaped like a circle having a diameter of 25 μm in plan view. The electrode terminal 4 on the circuit board 2 is also shaped like a circle having a diameter of 25 μm in plan view. The electrode terminal 3 on the semiconductor chip 1 has a thickness of 0.5 μm to 2.0 μm. The electrode terminal 4 on the circuit board 2 also has a thickness of 0.5 μm to 2.0 μm. A distance between the electrode terminals 3 (a distance between the centers of the adjacent electrode terminals 3) on the semiconductor chip 1 is 40 μm. Thus, a distance between the electrode terminals 4 (a distance between the centers of the adjacent electrode terminals 4) on the circuit board 2 is also 40 μm.

In the present embodiment, the projecting electrode 5 on the semiconductor chip 1 is a cylinder having a diameter of 20 μm and a height of 20 μm, and a distance between the centers of the adjacent projecting electrodes 5 is 40 μm. The projecting electrode 6 on the circuit board 2 is a cylinder having a diameter of 10 μm and a height of 10 μm, and a distance between the centers of the adjacent projecting electrodes 6 is 40 μm. Preferably, the diameter of the projecting electrode 6 is not smaller than the height of the projecting electrode 6 on the circuit board 2. Moreover, the projecting electrodes 6 on the circuit board 2 are preferably 0.4 to 0.7 times larger in diameter than the projecting electrodes 5 on the semiconductor chip 1.

In the present embodiment, the opening formed on the protective film 8 on the semiconductor chip 1 is a circle having a diameter of 20 μm. The opening on the protective film 9 on the circuit board 2 is also circular. The opening of the protective film 9 corresponding to the center of the semiconductor chip 1 has a diameter of 20 μm. The opening on the protective film 9 has a diameter of 10 μm near the corners (curved portions) of the semiconductor chip 1. The openings on the protective film 9 may gradually decrease in diameter from an area corresponding to the center of the semiconductor chip 1 to an area near the corner of the outside shape of the semiconductor chip 1. The protective film 8 on the semiconductor chip 1 and the protective film 9 on the circuit board 2 are about 0.5 μm to 5.0 μm in thickness.

Figure 4:
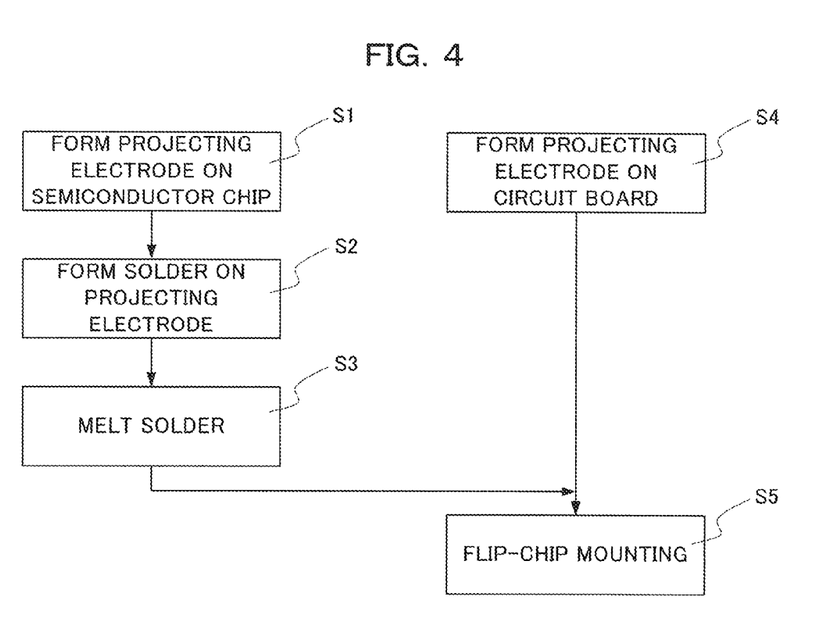
FIG. 4 is a flowchart showing a method of manufacturing the mounting structure of the electronic component according to the embodiment of the present invention.

A method of manufacturing the mounting structure of the electronic component according to the present embodiment will be described below. FIG. 4 is a flowchart showing the method of manufacturing the mounting structure of the electronic component according to the present embodiment. FIGS. 5A to 5D and FIGS. 6A to 6C are process cross-sectional views for explaining the method of manufacturing the mounting structure of the electronic component according to the present embodiment.

Figure 5A:
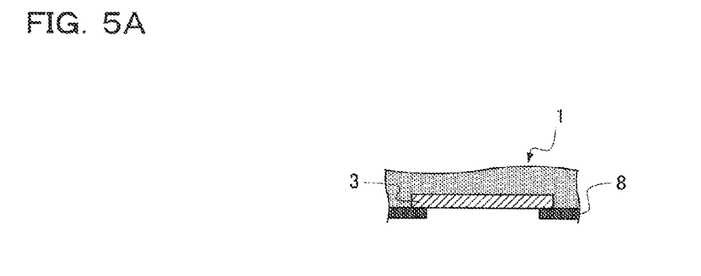
FIG. 5A is a process cross-sectional view for explaining the method of manufacturing the mounting structure of the electronic component according to the embodiment of the present invention.
Figure 5B:
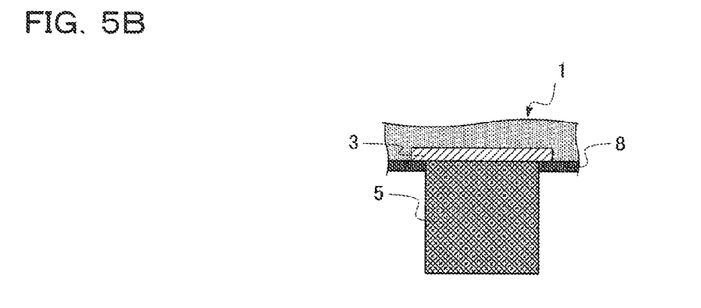
FIG. 5B is a process cross-sectional view for explaining the method of manufacturing the mounting structure of the electronic component according to the embodiment of the present invention.
Figure 5C:
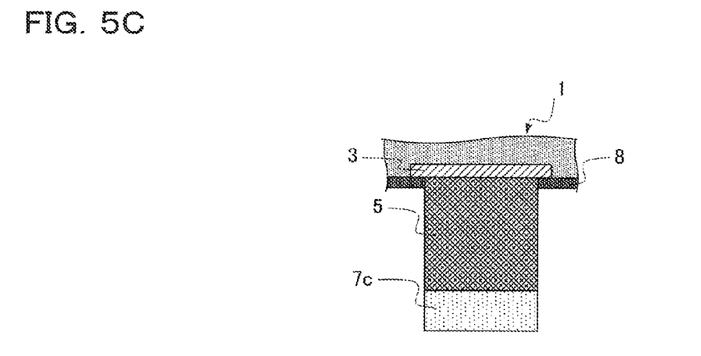
FIG. 5C is a process cross-sectional view for explaining the method of manufacturing the mounting structure of the electronic component according to the embodiment of the present invention.
Figure 5D:
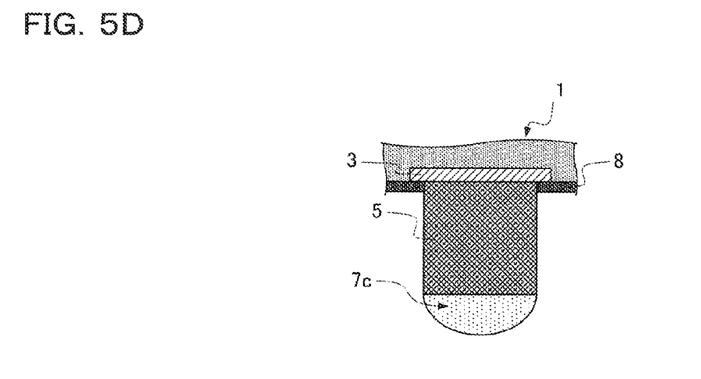
FIG. 5D is a process cross-sectional view for explaining the method of manufacturing the mounting structure of the electronic component according to the embodiment of the present invention.

In the present embodiment, the projecting electrodes 5 are collectively formed by electroplating on the respective electrode terminals 3 provided on each of the semiconductor chips 1 formed on a wafer. Specifically, as shown in FIG. 5A, impurities are first removed from the surfaces of the electrode terminals 3 made of aluminum (Al), and then the overall surface of the wafer (over a surface where the electrode terminals 3 are exposed) is sputtered with an under barrier metal (UBM) composed of TiW/Cu. Subsequently, a photoresist is applied over the wafer (over the surface where the electrode terminals 3 are exposed), and then the wafer undergoes exposure and development. After that, as shown in FIG. 5B, UBM exposed from a developed pattern (photoresist pattern) is plated with copper (Cu), forming the projecting electrodes 5 on the respective electrode terminals 3 (step S1 in FIG. 4). Subsequently, as shown in FIG. 5C, the projecting electrodes 5 are plated with solder 7c (step S2 in FIG. 4). After the photoresist is removed, unnecessary UBM is removed by etching. Subsequently, as shown in FIG. 5D, the wafer is heated at least to the melting point of the solder in a reflow furnace, thereby melting the solder 7c. Thus, the surface of the solder 7c on the projecting electrode 5 has a curved shape, for example, a hemispherical shape (step S3 in FIG. 4). The solder 7c may be melted as follows: the wafer is coated with flux and then is put into, for example, an $N_2$ reflow furnace to increase the temperature of the wafer at least to the melting point of the solder in an atmosphere of inert gas such as $N_2$. Alternatively, the solder 7c may be melted as follows: the wafer is put into a reducing reflow furnace to increase the temperature of the wafer at least to the melting point of the solder in a reducing atmosphere of, for example, formic acid or hydrogen.

Figure 6A:
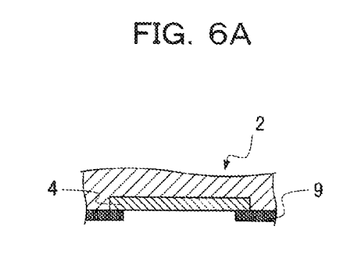
FIG. 6A is a process cross-sectional view for explaining the method of manufacturing the mounting structure of the electronic component according to the embodiment of the present invention.
Figure 6B:
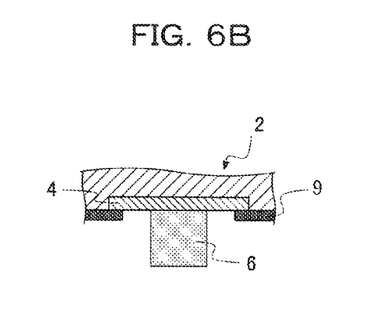
FIG. 6B is a process cross-sectional view for explaining the method of manufacturing the mounting structure of the electronic component according to the embodiment of the present invention.

The projecting electrodes 6 on the respective electrode terminals 4 on the circuit board 2 are formed by electroplating like the projecting electrodes 5 on the respective electrode terminals 3 on the semiconductor chip 1. Specifically, as shown in FIG. 6A, impurities are first removed from the surfaces of the electrode terminals 4 made of aluminum (Al), and then the overall surface of the circuit board 2 having the exposed electrode terminals 4 is sputtered with, for example, an UBM composed of TiW/Cu. Subsequently, a photoresist is applied over the surface of the circuit board 2 having the exposed electrode terminals 4, and then the circuit board 2 undergoes exposure and development. Then, as shown in FIG. 6B, the UBM exposed from a developed pattern (photoresist pattern) is plated with Ni, forming the projecting electrodes 6 on the respective electrode terminals 4 (step S4 in FIG. 4). After the photoresist is removed, an antioxidation film made of gold (Au) undergoes flash plating. Hence, the antioxidation film made of Au is formed on the surfaces of the projecting electrodes 6 on the circuit board 2. Subsequently, the unnecessary antioxidation film and unnecessary UBM are removed by etching.

Figure 6C:
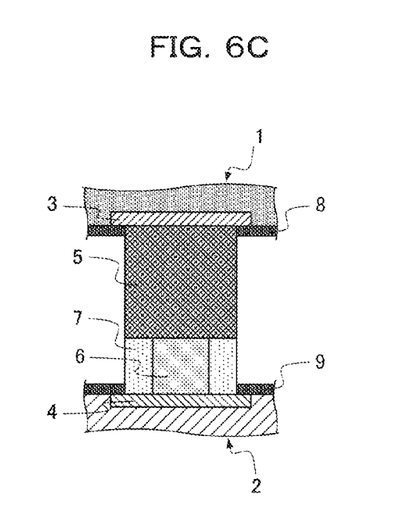
FIG. 6C is a process cross-sectional view for explaining the method of manufacturing the mounting structure of the electronic component according to the embodiment of the present invention.

The projecting electrodes 5 are formed on the respective electrode terminals 3 on the semiconductor chip 1, and the projecting electrodes 6 are formed on the respective electrode terminals 4 on the circuit board 2. After that, as shown in FIG. 6C, heat is applied to at least one of the semiconductor chip 1 and the circuit board 2; meanwhile, the projecting electrodes 5 on the semiconductor chip 1 are pressed to the projecting electrodes 6 on the circuit board 2. Thus, the semiconductor chip 1 is flip-chip mounted on the circuit board 2 (step S5 in FIG. 4).

Specifically, heat is first applied to at least one of the semiconductor chip 1 and the circuit board 2, heating the solder 7c supplied on the projecting electrodes 5 on the semiconductor chip 1 to at least the melting point of the solder (e.g., 220 to 260° C.). The solder 7c is melted by the heating operation.

Subsequently, the semiconductor chip 1 is pressed to the circuit board 2 to bring the tops of the projecting electrodes 5 on the semiconductor chip 1 into contact with the tops of the projecting electrodes 6 on the circuit board 2. Thus, the molten solder 7c is deformed so as to spread in a wet state to the Au surfaces of the projecting electrodes 6 on the circuit board 2. The semiconductor chip 1 is continuously pressed to the circuit board 2 until the molten solder 7 spreads in a wet state to the surfaces of the projecting electrodes 6 on the circuit board 2. Thus, the projecting electrodes 6 on the circuit board 2 are surrounded by the solder portion 7. In this process, Cu atoms contained in the projecting electrodes 5 on the semiconductor chip 1 are diffused into the molten solder 7c while Ni atoms contained in the projecting electrodes 6 on the circuit board 2 are diffused into the molten solder 7c. In the absence of a downstream process of diffusing Ni atoms into the molten solder 7c on the overall surfaces of the projecting electrodes 6, the semiconductor chip 1 is continuously pressed to the circuit board 2 until Ni atoms are diffused into the molten solder 7c on the overall surfaces of the projecting electrodes 6.

The method of manufacturing the mounting structure of the electronic component according to the present embodiment includes the step of melting the solder 7c so as to grow an alloy layer of a metal (copper) constituting the projecting electrodes 5 on the semiconductor chip 1 and a metal (tin) constituting the solder 7c and an alloy layer of a metal (nickel) constituting the projecting electrodes 6 on the circuit board 2 and a metal (tin) constituting the solder 7c. Thus, the alloy layer grown from the top of the projecting electrode 5 on the semiconductor chip 1 and the alloy layer grown from the top and side of the projecting electrode 6 on the circuit board 2 are surrounded by the solder.

Subsequently, the semiconductor chip 1 and the circuit board 2 are cooled at least to the freezing point of the solder, solidifying the solder 7c. As shown in FIG. 6C, the joining portions are formed so as to connect the electrode terminals 3 on the semiconductor chip 1 to the electrode terminals 4 on the circuit board 2 (step S5 in FIG. 4). Furthermore, the semiconductor chip 1 and the circuit board 2 are cooled to room temperature, obtaining the mounting structure of the electronic component.

In the mounting structure manufactured thus, as shown in FIG. 1, the outer end of the semiconductor chip 1 is warped in the cooling process of the molten solder 7c during the flip-chip mounting process. Thus, the overall semiconductor chip 1 projects downward, causing the joining portions near the corners (curved portions) of the outside shape of the semiconductor chip 1 to be taller than the joining portions around the center of the semiconductor chip 1. Consequently, as shown in FIG. 2, a distance between the top of the projecting electrode 5a on the semiconductor chip 1 and the top of the projecting electrode 6a on the circuit board 2 increases near the corners of the outside shape of the semiconductor chip 1, stretching the solder portion 7a.

In the mounting structure of the present embodiment, the joining portion expected to increase in height by a warp on the semiconductor chip 1 is located in one of the openings on the protective film 9, and the diameter of the opening (the area of the opening) is set according to an increase in the height of the expected joining portion. Specifically, the diameter of the opening decreases with an increase in the height of the expected joining portion. The solder 7c does not spread in a wet state to the surface of the protective film 9 on the circuit board 2. Thus, on the surface of the electrode terminal exposed from the opening having a smaller diameter (area) on the protective film 9, the wet solder 7c has a smaller area than on the surface of the electrode terminal exposed from the opening having a larger diameter (area) on the protective film 9. This suppresses the spread of the wet solder 7c onto the electrode terminals exposed from the openings of the protective film 9, the openings containing the joining portions that increase in height according to a warp of the semiconductor chip 1. Thus, the solder 7c stretched by a warp of the semiconductor chip 1 is unlikely to be broken and thus is sufficiently kept spreading on the tops (end faces) 51 of the projecting electrodes 5 on the semiconductor chip 1 fed with the solder 7c and the tops (end faces) 61 and sides of the projecting electrodes 6 on the circuit board 2 opposed to the projecting electrodes 5.

In the mounting structure according to the present embodiment, the projecting electrodes 6 on the circuit board 2 are smaller in diameter (cross-sectional area) than the projecting electrodes 5 on the semiconductor chip 1. Thus, as shown in FIG. 3, solder forming the solder portion 7b around the center of the semiconductor chip 1 spreads in a wet state onto the side of the projecting electrode 6b on the circuit board 2. Furthermore, as shown in FIG. 3, the diameter of the opening (opening area) of the protective film 9 on the circuit board 2 is larger than the diameter of the projecting electrode 6b (the bottom area of the projecting electrode 6b) on the circuit board 2, around the center of the semiconductor chip 1. This causes the solder forming the solder portion 7b to spread in a wet state onto the surface of the electrode terminal 4b on the circuit board 2. Thus, around the center of the semiconductor chip 1, the solder portion 7b is unlikely to spread out of the projection area on the bottom surface of the projecting electrode 5b on the semiconductor chip 1, reducing the occurrence of solder bridges.

The top of the projecting electrode 6 projects from the opening having a smaller diameter on the protective film 9 than the opening of the protective film 9 corresponding to the center of the semiconductor chip 1 and comes into contact with the top of the projecting electrode 5 on the semiconductor chip 1 opposed to the projecting electrode 6 before the semiconductor chip 1 is warped. Also in this case, the amount of the molten solder 7c spreading out of the projection area of the bottom of the projecting electrode 5 on the semiconductor chip 1 is unlikely to exceed an amount of spread causing a solder bridge. This is because the projecting electrodes 6 on the circuit board 2 are smaller in diameter (cross-sectional area) than the projecting electrodes 5 on the semiconductor chip 1 and the molten solder 7c spreads in a wet state onto the sides of the projecting electrodes 6 on the circuit board 2.

As has been discussed, according to the present embodiment, at least one of a modulus of elasticity and a coefficient of linear expansion varies between the semiconductor chip 1 and the circuit board 2. Even if the semiconductor chip 1 is warped in the step of cooling molten solder during the flip-chip mounting process, an electrical disconnection or a solder bridge is unlikely to occur between the electrode terminals 3 on the semiconductor chip 1 and the electrode terminals 4 on the circuit board 2, achieving high connection reliability. This is because wet solder is obtained from the tops (end faces) 51 of the projecting electrodes 5 on the semiconductor chip 1 to the sides of the projecting electrodes 6 on the circuit board 2. Moreover, the semiconductor chip 1 may also be warped in a use environment where large temperature differences occur. According to the present embodiment, wet solder is obtained from the tops (end faces) 51 of the projecting electrodes 5 on the semiconductor chip 1 to the sides of the projecting electrodes 6 on the circuit board 2. Thus, even if the semiconductor chip 1 is warped in a use environment where large temperature differences occur, an electrical disconnection or a solder bridge is unlikely to occur between the electrode terminals 3 on the semiconductor chip 1 and the electrode terminals 4 on the circuit board 2.

Therefore, the present embodiment can obtain high connection reliability even if at least one of the semiconductor chip 1 and the circuit board 2 is reduced in thickness in the mounting structure including the thin solder joints that electrically and mechanically connect the electrode terminals 3 on the semiconductor chip 1 to the electrode terminals 4 on the circuit board 2.

A gap between the semiconductor chip 1 and the circuit board 2 may be filled with molding resin by, for example, a dispenser (not shown). The molding resin reduces a stress applied to each of the electrode terminals 3 on the semiconductor chip 1, further improving connection reliability.

The volume of the solder portion 7 (the amount of the solder 7c supplied to the projecting electrode 5) will be described below. Relative to the dimensions of the projecting electrodes 5 and 6 contained in the joining portion provided with the solder portion 7, the volume of the solder portion 7 preferably satisfies the following relationship:

> The volume of the solder portion 7≤(the area of the top of the projecting electrode 5 on the semiconductor chip 1–the area of the bottom of the projecting electrode 6 on the circuit board 2)×the height of the projecting electrode 6 on the circuit board 2

In the joining portion satisfying the relationship of the expression, even when the tops of the projecting electrode 5 and the projecting electrode 6 contained in the joining portion come into contact with each other, the solder portion 7 does not spread out of the projection area of the bottom of the projecting electrode 5. Thus, the occurrence of solder bridges is eliminated, achieving higher connection reliability.

In the case where all the joining portions satisfy the relationship of the expression, the semiconductor chip 1 is pressed to the circuit board 2 such that all the tops of the projecting electrodes 5 on the semiconductor chip 1 come into contact with the tops of the projecting electrodes 6 on the circuit board 2, thereby preventing solder bridges. Thus, it is not necessary to control the height of the mounted semiconductor chip 1, allowing the semiconductor chip 1 to be mounted on the circuit board 2 in a shorter time.

The solder 7c may be melted and cooled in a state in which the height of the mounted semiconductor chip 1 is controlled so as not to bring the tops of the projecting electrodes 5 on the semiconductor chip 1 into contact with the tops of the projecting electrodes 6 on the circuit board 2. In this case, a warp on the semiconductor chip 1 reduces the height of the joining portion formed at the center of the semiconductor chip 1 and increases the heights of the joining portions formed near the corners of the outside shape of the semiconductor chip 1. In the mounting structure of the present embodiment, as has been discussed, the solder 7c stretched by a warp of the semiconductor chip 1 is unlikely to be broken and thus is sufficiently kept spreading on the tops (end faces) 51 of the projecting electrodes 5 on the semiconductor chip 1 fed with the solder 7c and the tops (end faces) 61 and sides of the projecting electrodes 6 on the circuit board 2 opposed to the projecting electrodes 5. In an area where the joining portions are reduced in height by a warp of the semiconductor chip 1, the solder 7c spreads in a wet state onto the surfaces of the electrode terminals 4 exposed in this area from the openings of the protective film 9. Thus, the solder portion 7 formed by the solder 7c is unlikely to spread out of the projection area of the bottom of the projecting electrode 5 contained in the joining portion provided with the solder portion 7, hardly leading to solder bridges.

When the joining portions are formed, a mounting pressure (load) is applied to the semiconductor chip 1 so as to press the semiconductor chip 1 to the circuit board 2, causing a reaction to apply a pressure from the end faces 61 of the projecting electrodes 6 on the circuit board 2 to the end faces 51 of the projecting electrodes 5 on the semiconductor chip 1. At this point, the mounting pressure may be set so as to form recesses on the end faces of the projecting electrodes 5 on the semiconductor chip 1. The recesses formed on the end faces 51 of the projecting electrodes 5 on the semiconductor chip 1 reduce the whole heights of the joining portions. Thus, even when the semiconductor chip 1 is further warped, an electrical connection can be easily obtained between the electrode terminals 3 on the outer end of the semiconductor chip 1 and the electrode terminals 4 provided for the respective electrode terminals 3 on the circuit board 2. The depths of the recesses formed on the projecting electrodes 5 on the semiconductor chip 1 are controlled by adjusting a mounting pressure (load). As a warp on the semiconductor chip 1 increases, a mounting pressure (load) preferably increases so as to deepen the recesses.

In contrast to the present embodiment, the tops (end faces) 51 of the projecting electrodes 5 on the semiconductor chip 1 may be smaller in area than the tops (end faces) 61 of the projecting electrodes 6 on the circuit board 2. In this case, the areas of the openings formed on the protective film 8 on the semiconductor chip 1 are adjusted so as to obtain the same effect as in the present embodiment.

As has been discussed, in a region where a distance between the semiconductor chip 1 and the circuit board 2 is increased by a warp of the semiconductor chip 1, the wet solder 7c on the surface of the electrode terminal 4 on the circuit board 2 has a smaller area than in the other region in the present embodiment. Thus, an electrical disconnection between the electrode terminals 3 on the semiconductor chip 1 and the respective electrode terminals 4 on the circuit board 2 is unlikely to occur in the region where a distance between the semiconductor chip 1 and the circuit board 2 increases. In a region where a distance between the semiconductor chip 1 and the circuit board 2 is reduced by a warp of the semiconductor chip 1, the wet solder 7c on the surface of the electrode terminal 4 on the circuit board 2 has a larger area than in the other region. Thus, in a region where a distance between the semiconductor chip 1 and the circuit board 2 decreases, solder 7c is unlikely to spread out of the projection area of the bottom of the projecting electrode 5 on the semiconductor chip 1, reducing the occurrence of solder bridges. This can reduce the occurrence of faults caused by an uneven distance between the semiconductor chip 1 and the circuit board 2 in the plane of the semiconductor chip 1 even if the solder portions 7 are identical in volume between the joining portions that connect the semiconductor chip 1 to the circuit board 2. Thus, even if the warped semiconductor chip 1 is mounted on the circuit board 2, high connection reliability can be obtained.

When the electrode terminals 3 on the semiconductor chip 1 are joined to the electrode terminals 4 on the circuit board 2, the end faces 51 of the projecting electrodes 5 on the semiconductor chip 1 come into contact with the end faces 61 of the projecting electrodes 6 on the circuit board 2 but hardly cause solder bridges. Thus, when the semiconductor chip 1 is mounted on the circuit board 2, the occurrence of solder bridges is reduced without controlling the height of the mounted semiconductor chip 1. This can eliminate the need for controlling the height of the mounted semiconductor chip 1, allowing the semiconductor chip 1 to be mounted on the circuit board 2 in a shorter time.

An exemplary embodiment according to the present invention has been described in detail. Those skilled in the art can easily understand that the exemplary embodiment may be changed in various ways without substantially departing from the new teaching of the present invention and the effect of the present invention. Hence, such various changes are intended to be included in the scope of the present invention.

What is claimed is:

1. A mounting structure, comprising:
an electronic component having a plurality of first electrode terminals;
a circuit board having a plurality of second electrode terminals for the respective first electrode terminals; and
a plurality of joining portions that join the first electrode terminals to the respective second electrode terminals,
wherein the joining portions each include a first projecting electrode formed on the first electrode terminal, a second projecting electrode formed on the second electrode terminal, and a solder portion that joins the first projecting electrode to the second projecting electrode,
each of the first projecting electrodes has an end face larger in area than an end face of the second projecting electrode,
at least a part of the second electrode terminals exposed from the circuit board has an area larger than an area of a bottom of the second projecting electrode, and
the second electrode terminal located in a region corresponding to an outer end of the electronic component is exposed from the circuit board so as to have a smaller exposed area than the second electrode terminal located in a region corresponding to a center of the electronic component.

2. A mounting structure, comprising:
an electronic component having a plurality of first electrode terminals;
a circuit board having a plurality of second electrode terminals for the respective first electrode terminals; and
a plurality of joining portions that join the first electrode terminals to the respective second electrode terminals,
wherein the joining portions each include a first projecting electrode formed on the first electrode terminal, a second projecting electrode formed on the second electrode terminal, and a solder portion that joins the first projecting electrode to the second projecting electrode,
each of the first projecting electrodes has an end face larger in area than an end face of the second projecting electrode,
at least a part of the second electrode terminals exposed from the circuit board has an area larger than an area of a bottom of the second projecting electrode, and the area of the end face of the first projecting electrode, a volume of the solder portion joining the first electrode to the second projecting electrode, an area of one of the end face and the bottom of the second projecting electrode, and a height of the second projecting electrode satisfy a relationship of an expression below:

$$\text{the volume of the solder portion} \leq (\text{the area of the end face of the first projecting electrode} - \text{the area of one of the end face and the bottom of the second projecting electrode}) \times \text{the height of the second projecting electrode}.$$

3. The mounting structure of the electronic component according to claim 2, wherein the first projecting electrodes are columnar, and the second projecting electrodes are columnar.

4. The mounting structure of the electronic component according to claim 2, wherein the solder portions are disposed around the respective second projecting electrodes.

5. The mounting structure of the electronic component according to claim 2, wherein the first projecting electrodes are cylindrical, the second projecting electrodes are cylindrical, and the second projecting electrodes each have a height and a diameter such that the height is not larger than the diameter.

6. The mounting structure of the electronic component according to claim 2, wherein the first projecting electrodes are cylindrical, the second projecting electrodes are cylindrical, and a diameter of the second projecting electrodes is 0.4 to 0.7 times a diameter of the first projecting electrodes.

7. The mounting structure of the electronic component according to claim 2, wherein the first projecting electrodes contain copper.

8. The mounting structure of the electronic component according to claim 2, wherein the second projecting electrodes contain one of copper and nickel.

9. The mounting structure of the electronic component according to claim 5, wherein each of the second projecting electrodes includes a gold surface layer.

10. The mounting structure of the electronic component according to claim 2, wherein the solder portions may contain tin.

* * * * *